(12) United States Patent
Nakahashi

(10) Patent No.: US 8,143,762 B2
(45) Date of Patent: Mar. 27, 2012

(54) ELASTIC WAVE DEVICE USING SH WAVES AS THE PRINCIPAL COMPONENT

(75) Inventor: Norihiko Nakahashi, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 13/248,137

(22) Filed: Sep. 29, 2011

(65) Prior Publication Data

US 2012/0019101 A1    Jan. 26, 2012

Related U.S. Application Data

(63) Continuation of application No. PCT/JP2010/051570, filed on Feb. 4, 2010.

(30) Foreign Application Priority Data

Mar. 30, 2009 (JP) ................................ 2009-082452

(51) Int. Cl.
*H03H 9/25* (2006.01)
*H01L 41/187* (2006.01)

(52) U.S. Cl. ................. 310/313 B; 310/313 R

(58) Field of Classification Search .......... None
See application file for complete search history.

(56) References Cited

U.S. PATENT DOCUMENTS

| | | | |
|---|---|---|---|
| 6,014,053 A | 1/2000 | Womack | |
| 7,315,107 B2* | 1/2008 | Kando et al. | 310/313 R |
| 7,486,001 B2* | 2/2009 | Kando | 310/313 R |
| 7,528,522 B2* | 5/2009 | Masuko et al. | 310/313 A |
| 7,863,801 B2* | 1/2011 | Kadota | 310/313 A |
| 7,868,523 B2* | 1/2011 | Tanaka et al. | 310/364 |
| 2008/0012450 A1 | 1/2008 | Meister et al. | |
| 2009/0115287 A1* | 5/2009 | Kando | 310/313 A |
| 2009/0302709 A1 | 12/2009 | Mimura | |
| 2010/0171389 A1* | 7/2010 | Yamanouchi et al. | 310/313 A |
| 2010/0187947 A1* | 7/2010 | Mimura | 310/313 A |

(Continued)

FOREIGN PATENT DOCUMENTS

| | | |
|---|---|---|
| EP | 1 879 291 A1 | 1/2008 |
| JP | 10-084247 A | 3/1998 |
| WO | 98/52278 A2 | 11/1998 |

(Continued)

OTHER PUBLICATIONS

Official Communication issued in International Patent Application No. PCT/JP2010/051570, mailed on Mar. 30, 2010.

*Primary Examiner* — J. San Martin
(74) *Attorney, Agent, or Firm* — Keating & Bennett, LLP

(57) ABSTRACT

An elastic wave device that achieves an improved frequency-temperature characteristic and a sufficiently reduced spurious component includes a piezoelectric body including a $LiNbO_3$ substrate, a first dielectric layer including a $SiO_2$ layer, a second dielectric layer, and IDT electrodes disposed at an interface between the piezoelectric body and the first dielectric layer. Each of the IDT electrodes includes a multilayer structure in which a first electrode film including at least one layer including Pt or a Pt-based alloy and a second electrode film including Al or an Al-based alloy are provided. $\phi$ and $\theta$ of Euler angles ($\phi$, $\theta$, $\psi$) of the $LiNbO_3$ substrate are in the range of $\phi=0\pm$about $2°$ and the range of about $80°\leq\theta\leq$about $130°$, respectively. $\psi$ is in the range of about $5°\leq\psi\leq$about $30°$. The normalized thickness $h/\lambda$ and $\psi$ satisfy the following expression: $h/\lambda\times100\leq$about $0.0019\times\psi2+$about $0.0115\times\psi+3.0$.

5 Claims, 13 Drawing Sheets

U.S. PATENT DOCUMENTS

2010/0259342 A1* 10/2010 Yamane ......................... 333/193
2010/0277036 A1* 11/2010 Shimizu et al. ............ 310/313 B
2011/0050034 A1* 3/2011 Yamane .................... 310/313 C

FOREIGN PATENT DOCUMENTS

| WO | 2006/058579 A1 | 6/2006 |
| WO | 2006/114930 A1 | 11/2006 |
| WO | 2008/108215 A1 | 9/2008 |

* cited by examiner

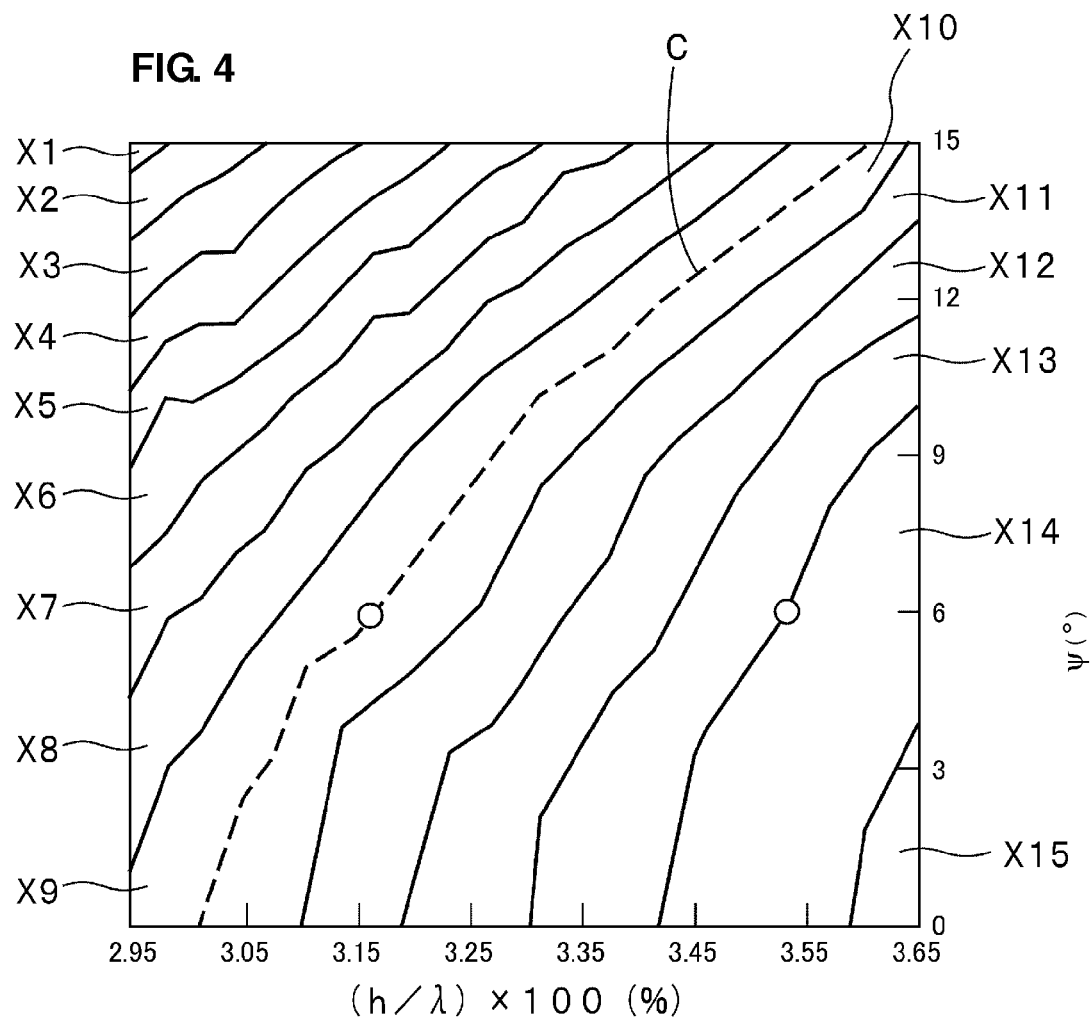

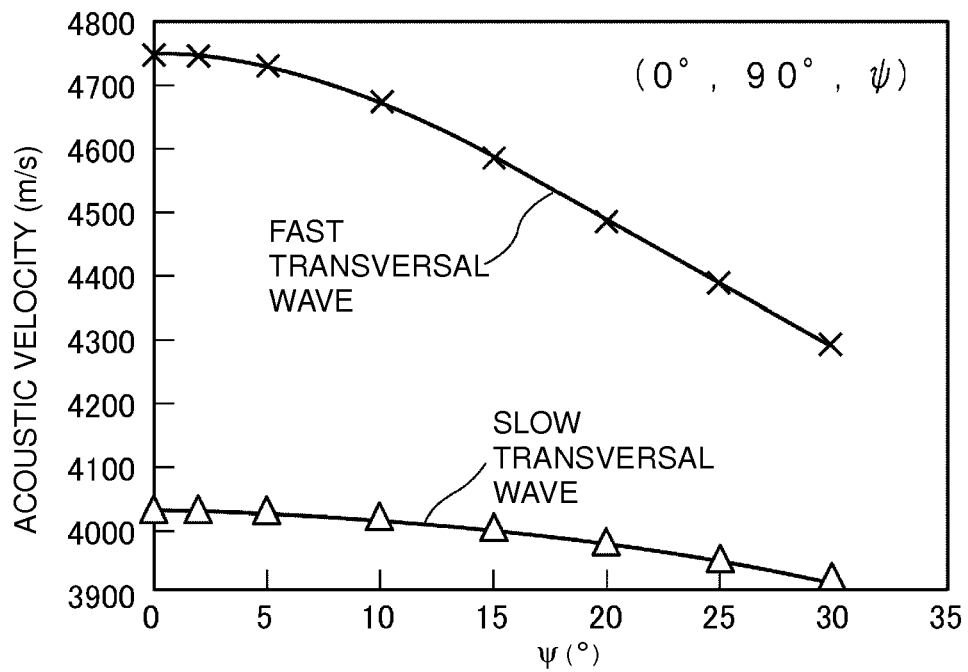
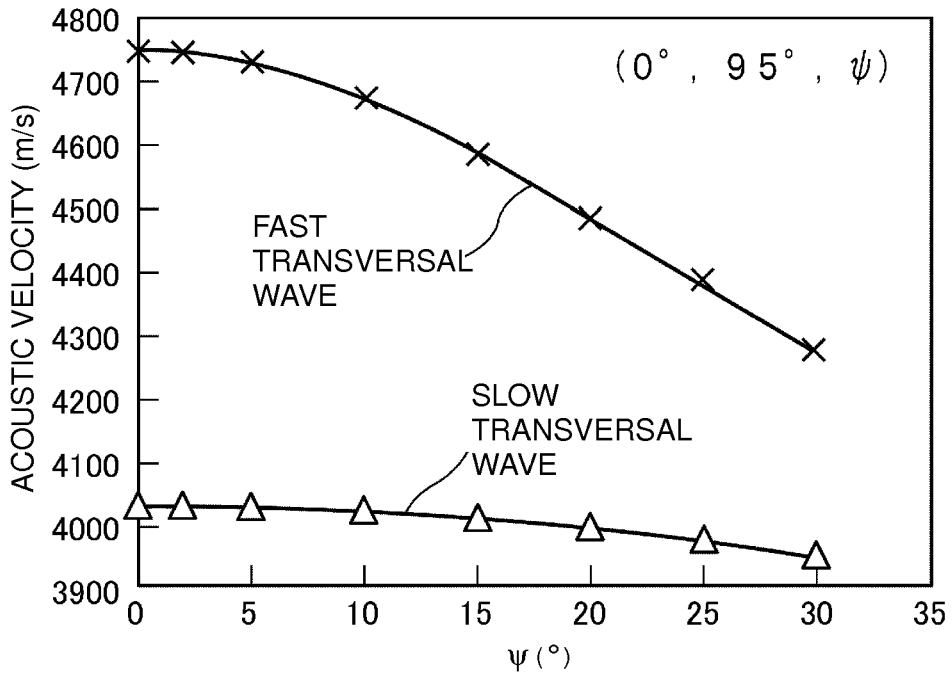

(0°, 90°, 0°)

(0°, 90°, 0°)

(0°, 100°, 0°)

ELASTIC WAVE DEVICE USING SH WAVES AS THE PRINCIPAL COMPONENT

BACKGROUND OF THE INVENTION

1. Field of the Invention

The present invention relates to an elastic wave device for use in a resonator or a band-pass filter. More specifically, the present invention relates to an elastic wave device that has a structure in which a $LiNbO_3$ substrate is preferably used as a piezoelectric body and a dielectric layer, such as a $SiO_2$ layer, is located on the piezoelectric body.

2. Description of the Related Art

Traditionally, elastic wave devices, such as boundary acoustic wave devices and surface acoustic wave devices, are used in band-pass filters of communication equipment, for example.

One example of this kind of boundary wave device is disclosed in WO98/52279 listed below. FIGS. 23 and 24 are a plan view that illustrates a boundary acoustic wave device described in WO98/52279 and a schematic partially cut-away front cross-sectional view that illustrates an enlarged main portion thereof, respectively.

A boundary acoustic wave device 1001 includes a $LiNbO_3$ substrate 1002. An IDT electrode 1003 is disposed on the $LiNbO_3$ substrate 1002. A polycrystalline silicon oxide film 1004 is arranged so as to cover the IDT electrode 1003. A polycrystalline silicon film 1005 is placed on the polycrystalline silicon oxide film 1004.

A boundary acoustic wave excited by the IDT electrode 1003 propagates while concentrating its energy in the polycrystalline silicon oxide film 1004 located between the $LiNbO_3$ substrate 1002 and the polycrystalline silicon film 1005. Accordingly, a boundary acoustic wave device having a so-called three-medium structure in which a polycrystalline silicon film, a polycrystalline silicon oxide film, and a $LiNbO_3$ substrate are placed in this order is formed.

WO98/52279 describes reliably confining a boundary acoustic wave excited by the IDT electrode 1003 in the polycrystalline silicon oxide film 1004 because the polycrystalline silicon film 1005 is placed on the polycrystalline silicon oxide film 1004.

WO2006/058579 listed below discloses a surface acoustic wave that includes a piezoelectric body, an electrode including a multilayer metal film in which a first layer and a second layer are placed in this order disposed on the piezoelectric body, and a dielectric layer covering the electrode. For this surface acoustic wave device, an acoustic impedance of the dielectric layer is Za, an acoustic impedance of the first layer of the electrode is smaller than 2Za, an acoustic impedance of the second layer of the electrode is higher than 2Za, and the percentage of the thickness of the second layer to the entire thickness of the multilayer structure of the first and second layers is in the range of 15%-85%. Here, an example of the material of the dielectric layer is $SiO_2$, an example of the material of the first layer is Al, and an example of the material of the second layer is Pt.

In the case of a single-layer Al electrode, because the ratio between the acoustic impedance of Al and that of $SiO_2$ of the dielectric layer is approximately one, its reflection coefficient cannot be high. In contrast to this, for an electrode having the above-described multilayer structure, its reflection coefficient can be high. In addition, because the Al layer can be thick, the resistance can be low, and thus the insertion loss can be small.

For the boundary acoustic wave device 1001 described in WO98/52279, a boundary acoustic wave propagates while concentrating its energy in the polycrystalline silicon oxide film 1004 between the $LiNbO_3$ substrate 1002 and the polycrystalline silicon film 1005, but there is a problem in that a spurious component caused by a higher mode of the boundary acoustic wave occurs. It has been found that the magnitude of this spurious component caused by a higher mode reduces with a reduction in the thickness of the polycrystalline silicon oxide film 1004. However, there is a problem in that a reduction in thickness of the polycrystalline silicon oxide film 1004 leads to an increase in the absolute value of a temperature coefficient of resonant frequency (TCF) of the boundary acoustic wave device 1001.

For the boundary acoustic wave device 1001 described in WO98/52279, the acoustic velocity of a transversal wave of the polycrystalline silicon oxide film 1004 is lower than that of each of the polycrystalline silicon film 1005 and the $LiNbO_3$ substrate 1002. Because the polycrystalline silicon oxide film 1004, in which an acoustic velocity of a transversal wave is low, is disposed between the polycrystalline silicon film 1005 and the $LiNbO_3$ substrate 1002, in which an acoustic velocity of a transversal wave is high, a boundary acoustic wave excited by the IDT electrode 1003 can be reliably confined in the polycrystalline silicon oxide film 1004. Therefore, boundary acoustic waves at the fundamental mode and a higher mode propagate through the polycrystalline silicon oxide film 1004.

The fundamental mode is a mode at which a single antinode is present in the polycrystalline silicon oxide film 1004, and it is so-called zeroth order mode. The higher mode is a mode at which a single node is present in the polycrystalline silicon oxide film 1004 and two anti-nodes having different displacement directions are present above or below the node, and it is a so-called first order mode.

A higher mode that has a plurality of nodes in the polycrystalline silicon oxide film 1004 may exist. However, responses at a higher mode other than the above-described higher mode are so small that they do not cause a problem.

The above-mentioned WO2006/058579 discloses merely the above specific multilayer structure as an electrode structure that can achieve an increased reflection coefficient and a reduced insertion loss in a surface acoustic wave device and does not describe any configuration that reduces a spurious component at a higher mode in a surface acoustic wave device.

As described above, for an elastic wave device in which a $SiO_2$ film covers an IDT electrode, an increase in the thickness of the $SiO_2$ film leads to an increase in a spurious component caused by a higher mode, and improvement in a frequency-temperature characteristic and reduction in a spurious component caused by a higher mode are a trade-off.

SUMMARY OF THE INVENTION

Preferred embodiments of the present invention solve the above-described drawbacks in the related art and provide an elastic wave device that has a structure in which a dielectric layer including a $SiO_2$ layer is located on a piezoelectric body including a $LiNbO_3$ substrate, that exhibits a good frequency-temperature characteristic, and that sufficiently reduces a spurious component caused by a higher mode.

According to a preferred embodiment of the present invention, an elastic wave device includes a piezoelectric body including a $LiNbO_3$ substrate, a first dielectric layer including a $SiO_2$ layer located on the piezoelectric body, a second dielectric layer located on the first dielectric layer, an acoustic velocity for the second dielectric layer being higher than that for the first dielectric layer, and an IDT electrode disposed in an interface between the piezoelectric body and the first dielectric layer. The IDT electrode principally includes a multilayer structure in which a first electrode film including at least one layer including Pt or a Pt-based alloy and a second electrode film including Al or an Al-based alloy are provided. φ and θ of Euler angles (φ, θ, ψ) of the LiNbO₃ substrate are preferably in the range of φ=0±about 2° and the range of about 80°≦θ≦about 130°, respectively. The elastic wave device uses an elastic wave whose principal component is an SH wave. ψ is in the range of about 5°≦ψ≦about 30°. Where a wavelength of the elastic wave is λ and a thickness of the first electrode film is h, a normalized thickness h/λ and ψ satisfy the following expression (1):

$$h/\lambda \times 100 \leq \text{about } 0.0019 \times \psi^2 + \text{about } 0.0115 \times \psi + \text{about } 3.0 \quad \text{Ex. (1)}$$

According to another preferred embodiment of the elastic wave device according to the present invention, θ of the Euler angles of the LiNbO₃ substrate may be in the range of about 105°≦θ≦about 120°. In this case, unnecessary mode responses appearing in the vicinity of a response of an elastic wave whose principal component is an SH wave are significantly reduced and minimized. That is, when the elastic wave device uses a boundary acoustic wave whose principal component is an SH wave, the electromechanical coupling coefficient of Stonely waves being an unnecessary mode can be small, and thus unnecessary mode responses can be reduced.

For another specific preferred embodiment of the elastic wave device according to the present invention, the normalized thickness h/λ may be at or above about 0.0295, for example. In this case, leakage at a fundamental mode can be prevented more efficiently.

For still another specific preferred embodiment of the elastic wave device according to the present invention, the second dielectric layer may include at least one dielectric material selected from the group consisting of silicon nitride, aluminum oxide, aluminum nitride, silicon oxinitride, and diamond-like carbon, and an acoustic velocity of a slow transversal wave in the dielectric material is at or above about 5000 m/s, for example.

For further another specific preferred embodiment of the elastic wave device according to the present invention, the IDT electrode may further include a third electrode film, and the third electrode film may include a metal selected from the group consisting of Au, Ag, Cu, Ta, W, Ni, Fe, Cr, Mo, Ti, and an alloy whose principal component is at least one of these metals. In this case, the reflection coefficient of the IDT electrode can be large.

For the elastic wave device according to a preferred embodiment of the present invention, the piezoelectric body including the LiNbO₃ substrate has a negative temperature coefficient of resonant frequency (TCF), whereas the first dielectric layer including the SiO₂ layer has a positive temperature coefficient of resonant frequency (TCF). Therefore, the absolute value of the temperature coefficient of resonant frequency (TCF) can be small. In addition, because ψ of the Euler angles of the LiNbO₃ substrate is in the above specific range, the IDT electrode has the above multilayer structure, and the normalized thickness h/λ is in the range satisfying the above expression (1), where h is the thickness of the first electrode film including Pt or a Pt-based alloy and λ is the wavelength of an elastic wave whose principal component is an SH wave, a spurious component caused by a higher mode can be reliably reduced.

Accordingly, both improvement in the frequency-temperature characteristic and reduction in the spurious component caused by a higher mode can be achieved.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 4 illustrates a relationship among a normalized thickness h/λ of a first electrode film of an IDT electrode, ψ of the Euler angles of a LiNbO₃ substrate, and a response at a higher mode.

FIG. 5 illustrates a relationship between ψ and each of an acoustic velocity of a fast transversal wave and an acoustic velocity of a slow transversal wave in a LiNbO₃ substrate whose Euler angles are (0°, 90°, ψ).

FIG. 6 illustrates a relationship between ψ and each of an acoustic velocity of a fast transversal wave and an acoustic velocity of a slow transversal wave in a LiNbO₃ substrate whose Euler angles are (0°, 95°, ψ).

DETAILED DESCRIPTION OF THE PREFERRED EMBODIMENTS

The present invention is described with respect to specific preferred embodiments thereof below with reference to the drawings.

Figure 1A:
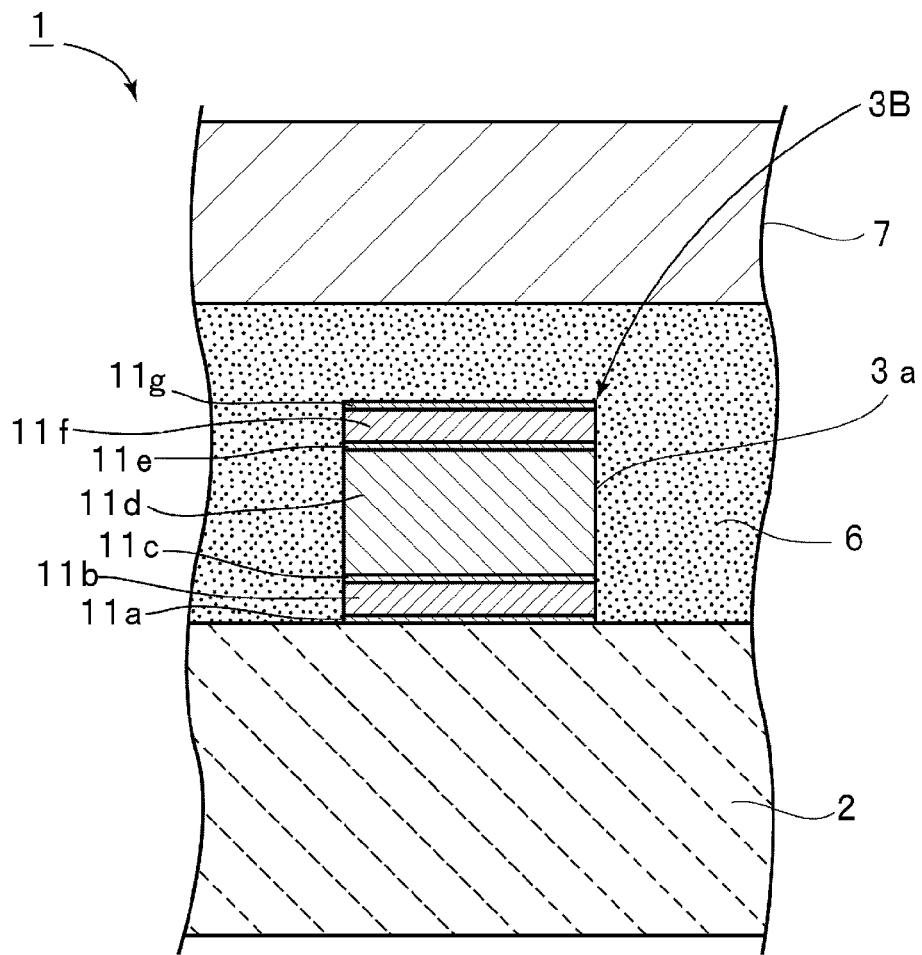
FIGS. 1A and 1B are a partially cut-away enlarged front cross-sectional view that illustrates a main portion of a boundary acoustic wave device according to a preferred embodiment of the present invention and a schematic plan view that illustrates an electrode structure thereof.
Figure 1B:
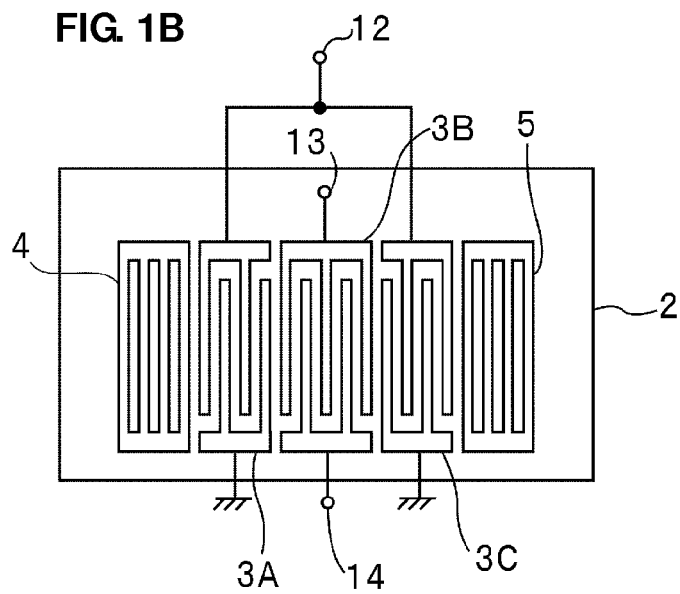

FIG. 1A is a partially cut-away enlarged front cross-sectional view that illustrates a main portion of a boundary acoustic wave device according to a preferred embodiment of the present invention, and FIG. 1B is a schematic plan view that illustrates an electrode structure of the boundary acoustic wave device.

A boundary acoustic wave device 1 is a boundary acoustic wave device that uses a boundary acoustic wave whose principal component is an SH wave. It is known that bulk waves propagating through a solid can be classified into three types of longitudinal waves, fast transversal waves, and slow transversal waves, which are called P-waves, SH-waves, and SV-waves, respectively. Among these three types of bulk waves, a bulk wave having the lowest acoustic velocity is a slow transversal wave.

As illustrated in FIG. 1A, the boundary acoustic wave device 1 includes a piezoelectric body 2 including a LiNbO₃ substrate. A first dielectric layer 6 including a SiO₂ layer is located on the piezoelectric body 2.

IDT electrodes 3A to 3C are disposed at an interface between the piezoelectric body 2 and the first dielectric layer 6. FIG. 1A illustrates a portion of a single electrode finger of the IDT electrode 3B in a cross-sectional view in an enlarged manner. In actuality, as illustrated in FIG. 1B, the IDT electrodes 3A to 3C are arranged on the piezoelectric body 2 in sequence along the direction of propagation of a boundary acoustic wave. Reflectors 4 and 5 are arranged at both sides of the IDT electrodes 3A to 3C in the direction of propagation of a boundary acoustic wave. Accordingly, for the present preferred embodiment, a 3-IDT longitudinally coupled resonator-type boundary acoustic wave filter is configured. Here, each of the IDT electrodes 3A and 3C includes a first end connected to an unbalanced terminal 12 and a second end connected to a ground potential. The IDT electrode 3B includes a first end connected to a first balanced terminal 13 and a second end connected to a second balanced terminal 14. Therefore, the boundary acoustic wave device 1 according to the present preferred embodiment is a 3-IDT longitudinally coupled resonator-type boundary acoustic wave filter having the balanced-unbalanced transforming function.

Each of the IDT electrodes 3A to 3C includes interlocking electrode fingers. FIG. 1A illustrates an enlarged single electrode finger 3a of the IDT electrode 3B.

Each of the IDT electrodes 3A to 3C and the reflectors 4 and 5 includes an appropriate metal material. For the present preferred embodiment, as illustrated in FIG. 1A in an enlarged manner, the electrode finger 3a of the IDT electrode 3B includes a multilayer metal film obtained by placing a Ti film 11a, a Pt film 11b, a Ti film 11c, an Al film 11d, a Ti film 11e, a Pt film 11f, and a Ti film 11g in this order from the side adjacent to the piezoelectric body 2. In the multilayer metal film, the Pt film 11b, Al film 11d, and Pt film 11f are thicker than the Ti films 11a, 11c, 11e, and 11g. These Pt film 11b, Al film 11d, and Pt film 11f are a main electrode film and define a multilayer structure according to a preferred embodiment of the present invention.

That is, the Pt films 11b and 11f correspond to a first electrode film of a preferred embodiment of the present invention, and the Al film 11d corresponds to a second electrode film. For a preferred embodiment of the present invention, the first electrode film included in the multilayer structure may also be a film including a Pt-based alloy. Similarly, the second electrode film may also be a film including an Al-based alloy.

As in the present preferred embodiment, the first electrode film may include the plurality of Pt films 11b and 11f. In this case, the thickness h of the first electrode film is the sum of the thicknesses of all of the Pt films. That is, when the multilayer structure includes a plurality of first electrode films, the thickness h of the first electrode films in the multilayer structure is the sum of the thicknesses of the first electrode films. The multilayer structure may also include a plurality of second electrode films.

The Ti film 11a functions as an adherence layer to increase the adherence ability of the IDT electrode 3B to the piezoelectric body 2. The Ti films 11c and 11e are arranged to define a barrier layer to reduce diffusion between the upper and lower electrode films. That is, the Ti films 11c and 11e are arranged so as to reduce diffusion of atoms between the Al film 11d and each of the Pt films 11b and 11f. The Ti film 11g is arranged to define an adherence layer to increase the adherence ability between the first dielectric layer 6 and the Pt film 11f. The IDT electrode 3B is made of such a multilayer metal film as a whole, and the IDT electrodes 3A and 3C and the reflectors 4 and 5 are also made of the same multilayer metal film.

For the boundary acoustic wave device 1 according to the present preferred embodiment, the first dielectric layer 6 is arranged on the upper surface of the piezoelectric body 2 so as to cover the IDT electrodes 3A to 3C, and a second dielectric layer 7 is also arranged on the first dielectric layer 6. For the present preferred embodiment, the second dielectric layer 7 includes a SiN layer.

The first dielectric layer 6, which includes a SiO₂ layer, and the second dielectric layer 7, which includes a SiN layer, can be formed by an appropriate thin-film forming method, such as vapor deposition or sputtering. The second dielectric layer 7 may also be formed by a substrate bonding technique illustrated in Japanese Unexamined Patent Application Publication No. 10-84247.

The thickness of the first dielectric layer 6 is not particularly limited, but it may preferably be about $0.2\lambda$ to about $0.7\lambda$, for example, where $\lambda$ is the wavelength of a boundary acoustic wave whose principal component is an SH wave. Because the acoustic velocity of a transversal wave in the $SiO_2$ layer being the first dielectric layer 6 is lower than that in the SiN layer being the second dielectric layer 7 and that of the $LiNbO_3$ substrate being the piezoelectric body 2, a boundary acoustic wave whose principal component is an SH wave excited by the IDT electrodes 3A to 3C propagates while concentrating its energy between the SiN layer being the second dielectric layer 7 and the $LiNbO_3$ substrate being the piezoelectric body 2, that is, in the first dielectric layer 6 including the $SiO_2$ layer. To enable such propagation, the thickness of the first dielectric layer 6 may preferably be about $0.2\lambda$ to about $0.7\lambda$, for example.

The thickness of the second dielectric layer 7 is set at that enabling a boundary acoustic wave to be sufficiently confined. That is, it is set at a thickness at which the displacement of a boundary acoustic wave reduces toward the direction of the thickness of the second dielectric layer 7 and the displacement of a boundary acoustic wave at the surface of the second dielectric layer 7 is substantially zero. The thickness at which the displacement is assumed to be substantially zero can be about $1\lambda$ or more, where $\lambda$ is the wavelength of a boundary acoustic wave whose principal component is an SH wave, for example.

The electrode structure containing the above-described IDT electrodes 3A to 3C can also be formed by photolithography, for example.

For the boundary acoustic wave device 1 according to the present preferred embodiment, a boundary acoustic wave whose principal component is an SH wave excited by the IDT electrodes 3A to 3C disposed in an interface between the piezoelectric body 2 including the $LiNbO_3$ substrate and the first dielectric layer 6 including the $SiO_2$ layer propagates while concentrating its energy in the first dielectric layer 6. Here, the second dielectric layer 7 includes the SiN layer, and the acoustic velocity of a transversal wave therein is higher than the acoustic velocity of a transversal wave in the first dielectric layer 6 including the $SiO_2$ layer. Therefore, a boundary acoustic wave does not tend to leak to the second dielectric layer 7 including the SiN layer and reliably propagates while concentrating its energy in the first dielectric layer 6 including the $SiO_2$ layer.

Additionally, for the boundary acoustic wave device 1, the temperature coefficient of resonant frequency (TCF) of the $LiNbO_3$ substrate being the piezoelectric body 2 is negative, whereas the temperature coefficient of resonant frequency (TCF) of the $SiO_2$ layer being the first dielectric layer 6 is positive. Therefore, the absolute value of the temperature coefficient of resonant frequency (TCF) as a whole can be small. Accordingly, variations in frequency caused by temperature changes can be small.

In addition, a feature of the present preferred embodiment is that the Euler angles ($\phi$, $\theta$, $\psi$) of the $LiNbO_3$ substrate defining the piezoelectric body 2 are preferably in the range of $\phi=0\pm$about $2°$, about $80°\leq\theta\leq$about $130°$, about $5°\leq\psi\leq$about $30°$, each of the IDT electrodes 3A to 3C includes a multilayer structure of the Pt films 11b and 11f and the Al film 11d, and the normalized thickness $h/\lambda$ satisfies the following Expression (1), where h is the sum of the thicknesses of the Pt films 11b and 11f. This enables efficient reduction in spurious component caused by a higher mode. It may be most preferable that $\phi$ be $0°$, but in consideration of manufacturing variations, it may be another value as long as it is preferably $0\pm$about $2°$.

$$h/\lambda\times100\leq\text{about } 0.0019\times\psi^2+\text{about } 0.0115\times\psi+\text{about } 3.0 \qquad \text{Ex. (1)}$$

In the expression (1), $\lambda$ indicates the wavelength of a boundary acoustic wave whose principal component is an SH wave.

For a single Pt layer, the overall thickness h of Pt films in the multilayer structure of the IDT electrode is the thickness of the single Pt layer; for a plurality of Pt layers, the overall thickness h is the sum of the thicknesses of the plurality of Pt layers.

The ability to efficiently reduce a spurious component caused by a higher mode while improving a frequency-temperature characteristic is clarified with reference to FIGS. 2 to 13.

In accordance with the above-described preferred embodiment, a GSM1900 reception filter of experimental examples 1 and 2 was produced. The specifications of the GSM1900 reception filter of a cellular phone are described below:

Pass band: about 1930 MHz to about 1900 MHz

Insertion loss within pass band: at or below about 2.5 dB

Lower-range stop band: about 1830 MHz to about 1910 MHz

Attenuation in lower-range stop band: at or above about 12 dB

Higher-range stop band: about 2010 MHz to about 2070 MHz

Attenuation in higher-range stop band: at or above about 12 dB

The boundary acoustic wave device 1 according to the experimental example 1 having the following configuration was produced so as to satisfy the above specifications.

Thicknesses and electrode structure of electrode films of IDT electrodes 3A to 3C:

Thickness of Pt film 11f in upper portion of multilayer structure: about 31 nm

Normalized thickness: about 0.0178

Thickness of Pt film 11b in lower portion: about 31 nm

Normalized thickness: about 0.0178

Thickness of Al film 11d: about 260 nm

Normalized thickness: about 0.0149

Thickness of Ti films 11a, 11c, 11e, and 11g as adherence layer and barrier layer: about 40 nm Normalized thickness: about 0.023

The boundary acoustic wave device according to the experimental example 2 described below was produced in a similar way.

The absolute value and electrode structure of the thickness of each of the IDT electrodes 3A to 3C of the boundary acoustic wave device according to the experimental example 2 were similar to those in the above experimental example 1. The wavelength $\lambda$ of a boundary acoustic wave defined by the pitch of electrode fingers of the IDT electrodes 3A to 3C was about 1.7 μm for the experimental example 1 and about 1.49 μm for the experimental example 2. Accordingly, for the experimental example 2, the normalized thickness of each of the Pt films 11f and 11b was about 0.016, and the normalized thickness of the Al film 11d was about 0.0134. The normalized thickness of each of the Ti films 11a, 11c, 11e, and 11g was about 0.0206.

The thickness of the first dielectric layer 6 including a $SiO_2$ layer was about 590 nm. The normalized thickness of the first dielectric layer 6 is about $0.339\lambda$ for the experimental example 1 and about $0.304\lambda$ for the experimental example 2.

The thickness of the second dielectric layer 7 including a SiN layer was about 2200 nm. The normalized thickness of the second dielectric layer 7 is about 1.264λ for the experimental example 1 and about 1.134λ for the experimental example 2.

The experimental example 2 was configured so as to be similar to the experimental example 1, except that the wavelength of a boundary acoustic wave defined by the pitch of electrode fingers was changed from about 1.74 μm to about 1.94 μm and thus the normalized thickness of each layer was slightly different from that in the experimental example 1 described above.

The intersecting width of electrode fingers of each of the IDT electrodes 3A to 3C was about 42λ. The total number of electrode fingers of the IDT electrode 3B was 36. For the IDT electrode 3B, a small-pitch electrode finger portion was disposed at each of both ends, the number of electrode fingers of each small-pitch electrode finger portion was 3, and therefore, the number of the remaining electrode fingers was 30 (=36−6).

For each of the IDT electrodes 3A and 3C, the total number of electrode fingers was 19. For each of the IDT electrodes 3A and 3C, a small-pitch electrode finger portion was disposed at an end adjacent to the IDT electrode 3B, and the three electrode fingers at the end adjacent to the IDT electrode 3B were electrode fingers defining the small-pitch electrode finger portion.

The number of electrode fingers of the reflectors 4 and 5 was 61.

The duty ratio in the IDT electrodes 3A to 3C was about 0.50.

Figure 2:
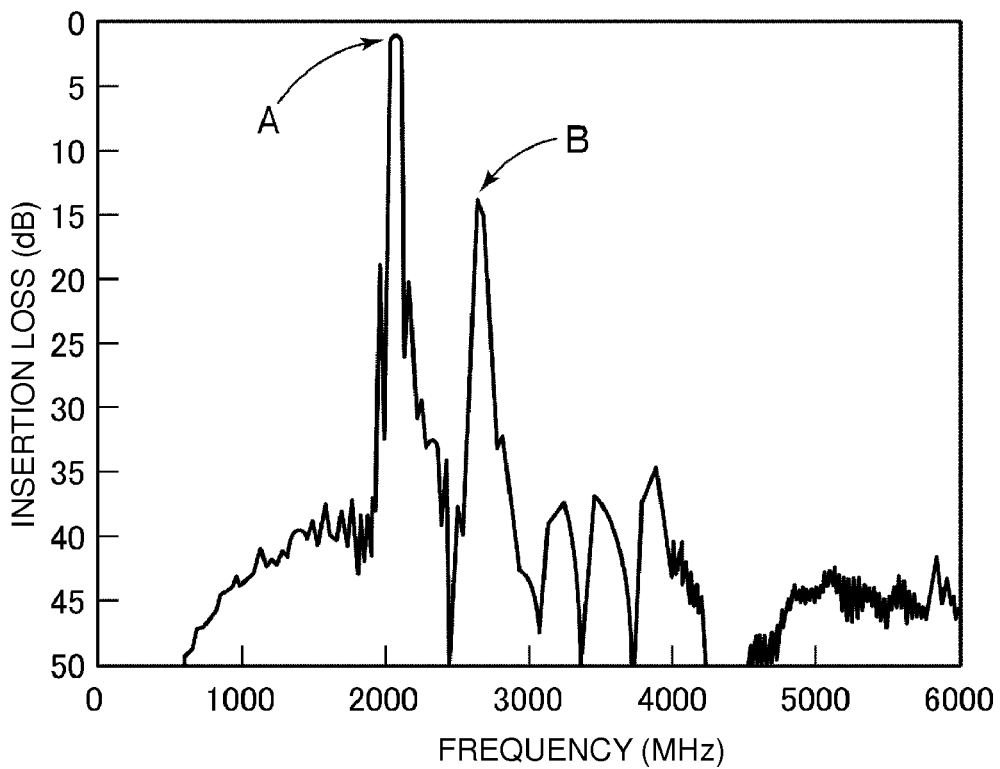
FIG. 2 illustrates a transmission characteristic of the boundary acoustic wave device according to a preferred embodiment of the present invention.
Figure 3:
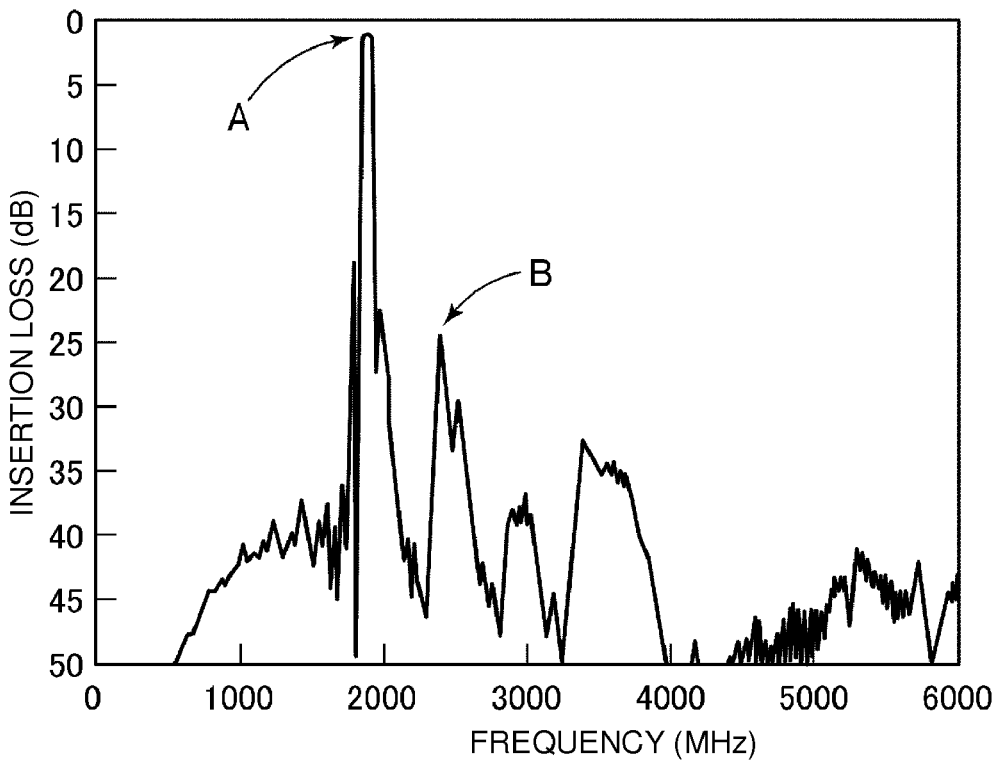
FIG. 3 illustrates a transmission characteristic of the boundary acoustic wave device according to a preferred embodiment of the present invention.
Figure 7:
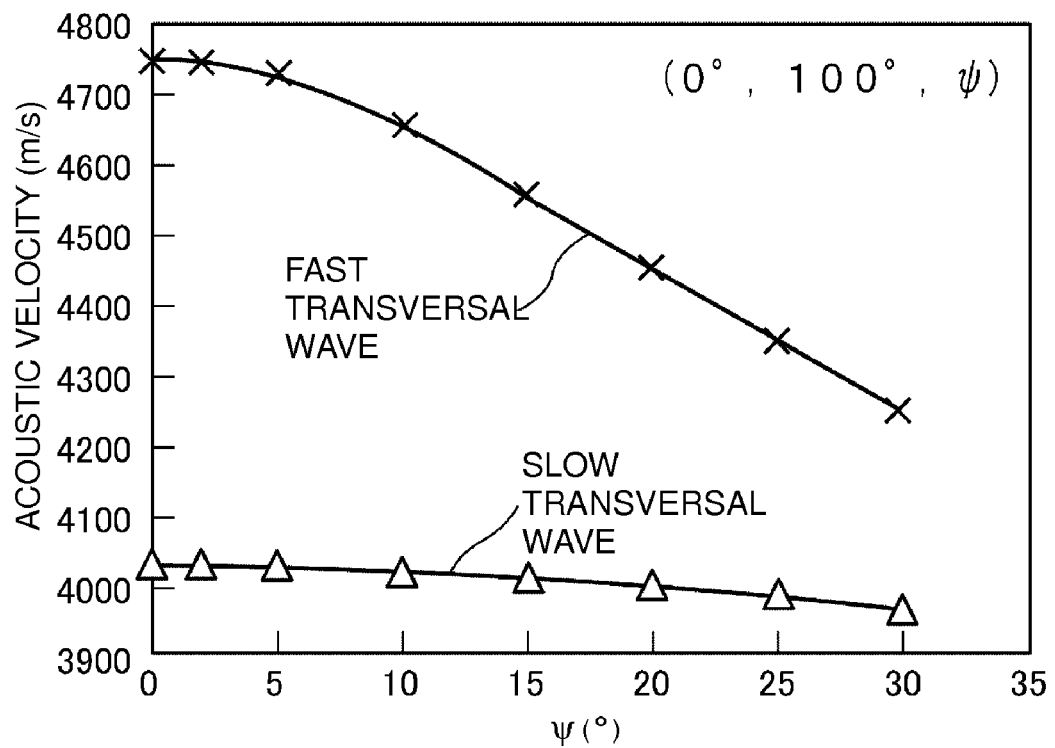
FIG. 7 illustrates a relationship between ψ and each of an acoustic velocity of a fast transversal wave and an acoustic velocity of a slow transversal wave in a LiNbO₃ substrate whose Euler angles are (0°, 100°, ψ).
Figure 8:
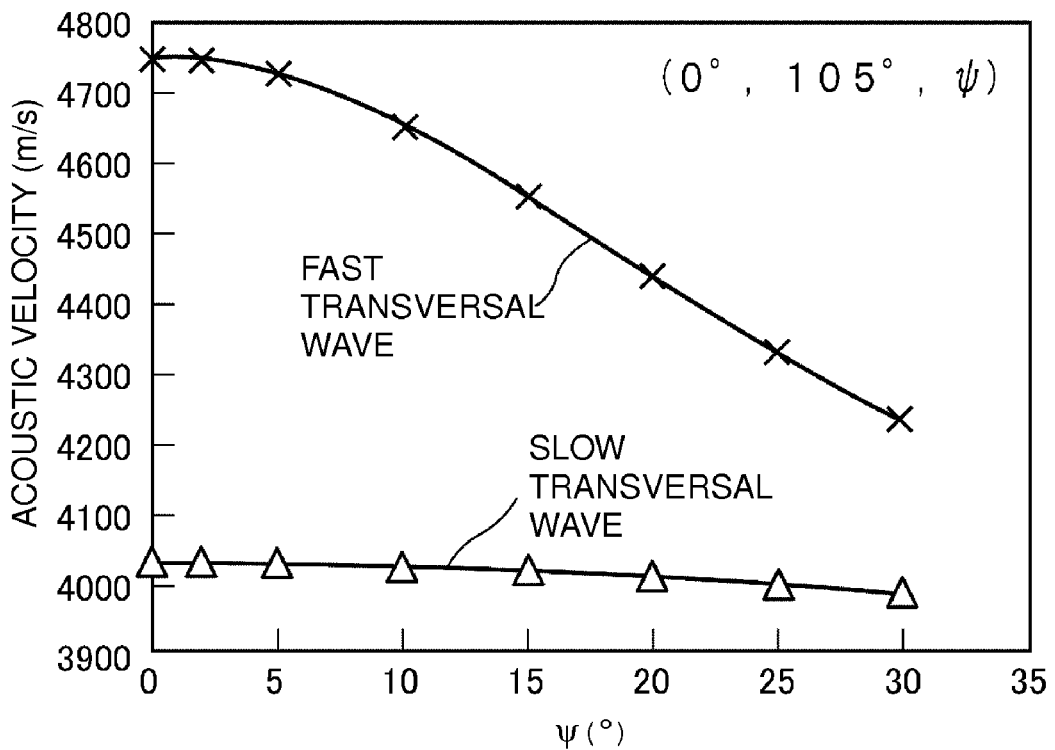
FIG. 8 illustrates a relationship between ψ and each of an acoustic velocity of a fast transversal wave and an acoustic velocity of a slow transversal wave in a LiNbO₃ substrate whose Euler angles are (0°, 105°, ψ).
Figure 9:
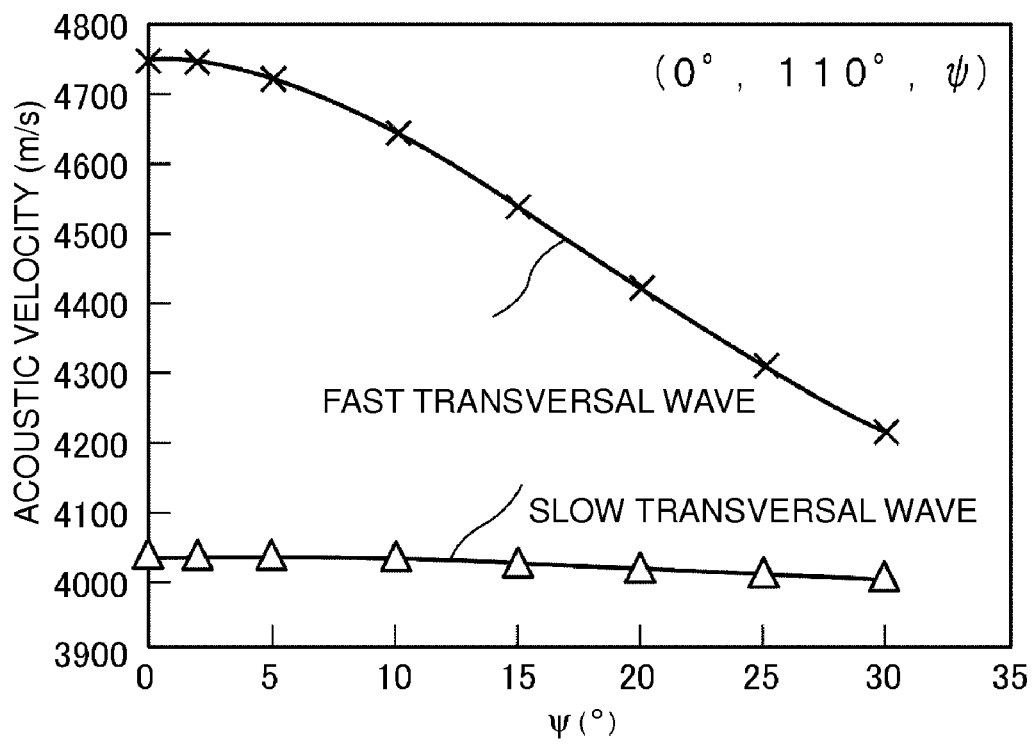
FIG. 9 illustrates a relationship between ψ and each of an acoustic velocity of a fast transversal wave and an acoustic velocity of a slow transversal wave in a LiNbO₃ substrate whose Euler angles are (0°, 110°, ψ).
Figure 10:
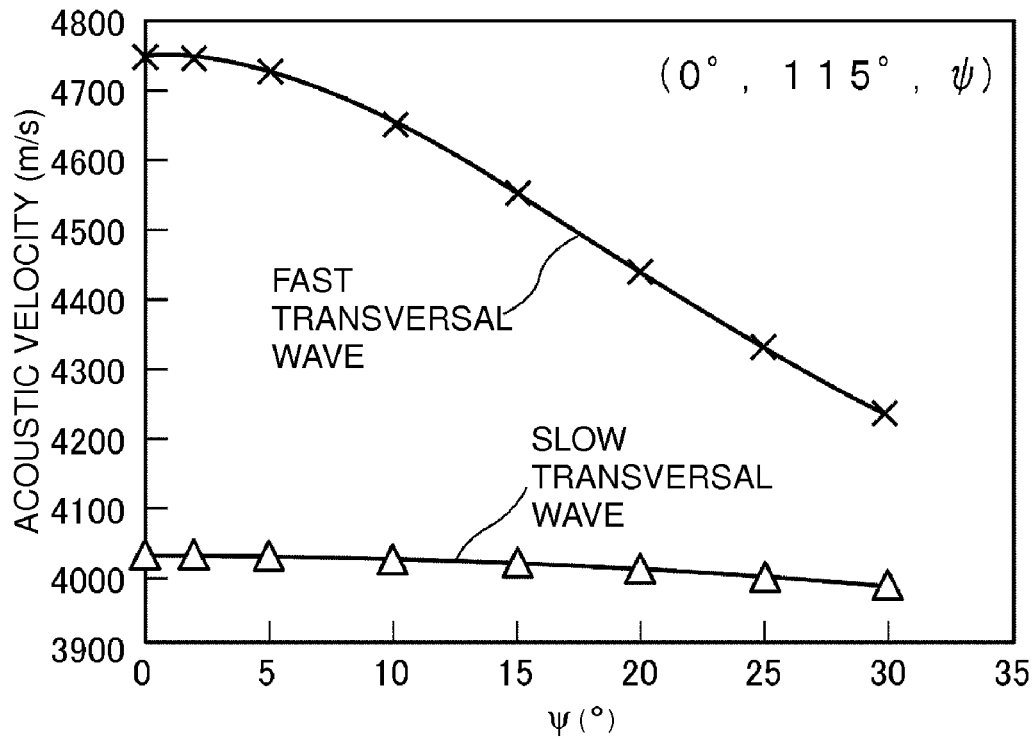
FIG. 10 illustrates a relationship between ψ and each of an acoustic velocity of a fast transversal wave and an acoustic velocity of a slow transversal wave in a LiNbO₃ substrate whose Euler angles are (0°, 115°, ψ).
Figure 11:
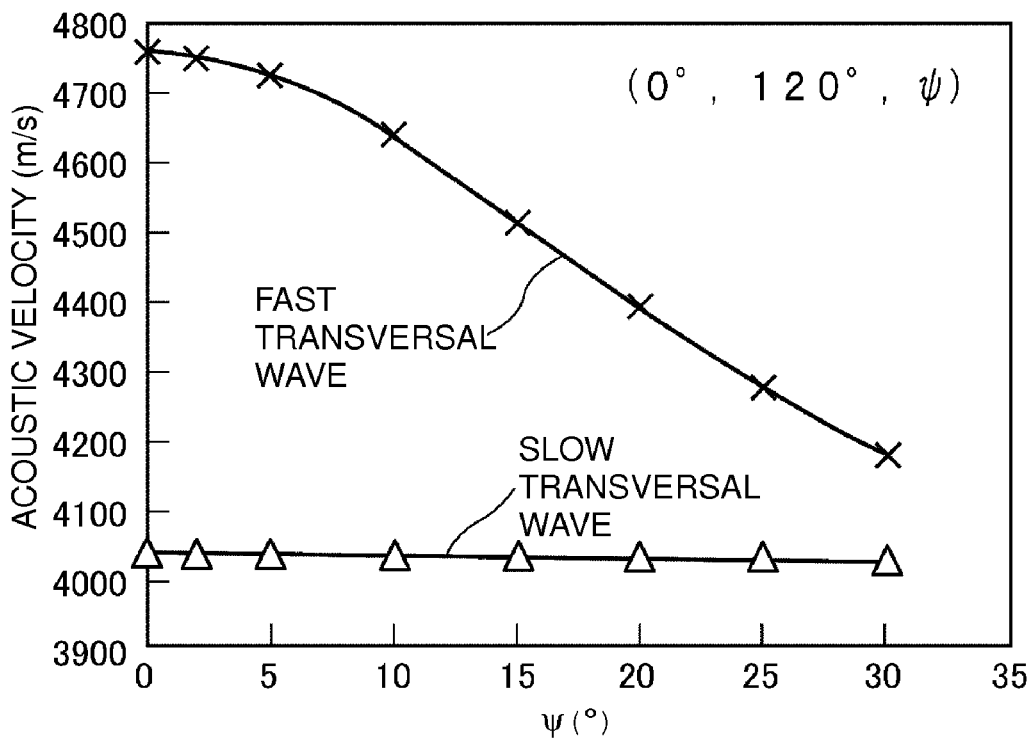
FIG. 11 illustrates a relationship between ψ and each of an acoustic velocity of a fast transversal wave and an acoustic velocity of a slow transversal wave in a LiNbO₃ substrate whose Euler angles are (0°, 120°, ψ).
Figure 12:
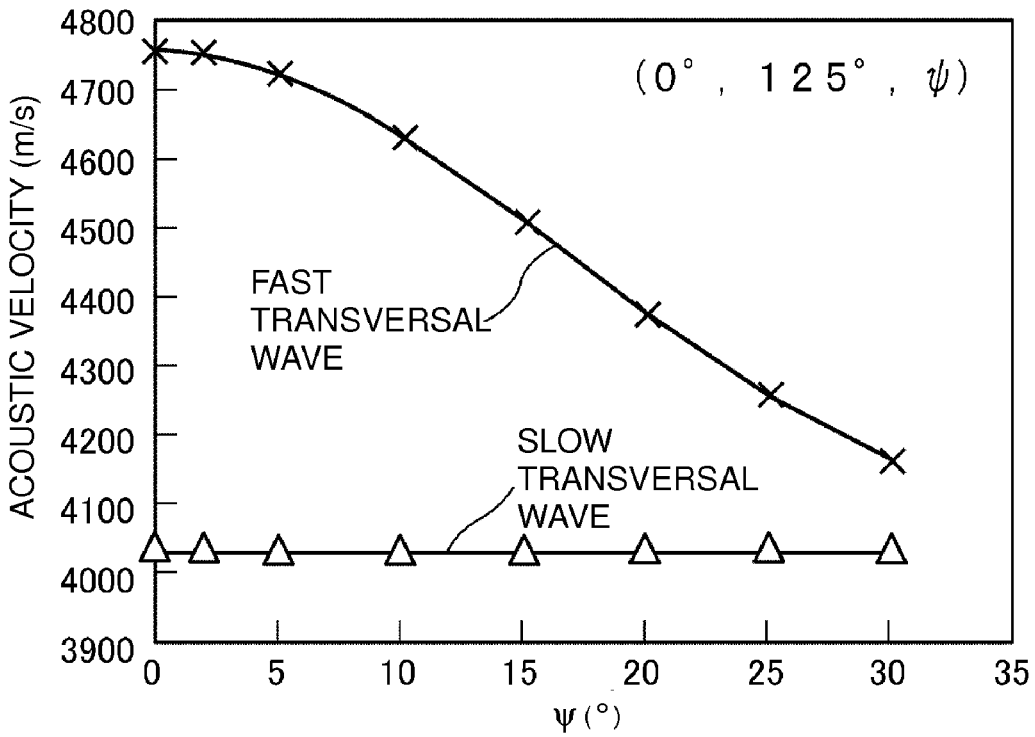
FIG. 12 illustrates a relationship between ψ and each of an acoustic velocity of a fast transversal wave and an acoustic velocity of a slow transversal wave in a LiNbO₃ substrate whose Euler angles are (0°, 125°, ψ).
Figure 13:
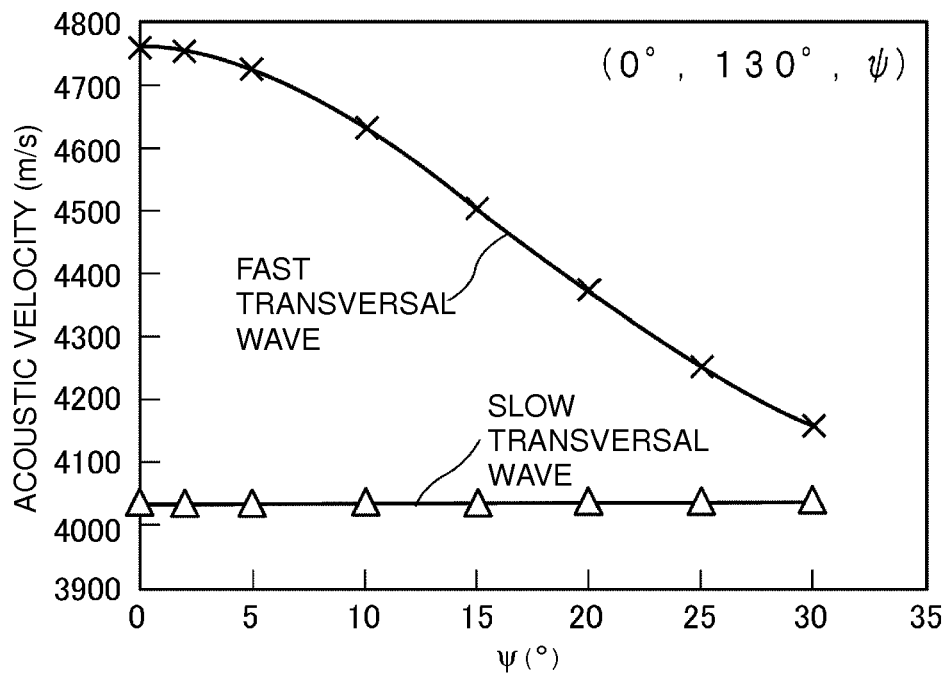
FIG. 13 illustrates a relationship between ψ and each of an acoustic velocity of a fast transversal wave and an acoustic velocity of a slow transversal wave in a LiNbO₃ substrate whose Euler angles are (0°, 130°, ψ).

FIG. 2 illustrates a transmission characteristic according to the experimental example 1, and FIG. 3 illustrates a transmission characteristic according to the experimental example 2. In each of FIGS. 2 and 3, the arrow A indicates a response at a fundamental mode, the arrow B indicates a response at a higher mode. As illustrated in FIG. 2, for the experimental example 1, the response at a higher mode is about 15 dB. As illustrated in FIG. 3, for the experimental example 2, the response at a higher mode is about 25 dB. The GSM blocking standard is the insertion loss within the pass band of about +23 dB. In general, the insertion loss within the pass band is approximately 2 dB, and thus at least 25 dB is necessary as the response at a higher mode. Accordingly, it may be preferable that the response at a higher mode be reduced to the level at a higher mode illustrated in FIG. 3.

FIG. 4 illustrates changes in response at a higher mode when the normalized thickness h/λ and ψ of the Euler angles of the LiNbO₃ substrate being the piezoelectric body 2 are changed, where h is the thickness of the sum of the thicknesses of the Pt films 11b and 11f being the first electrode film in the multilayer structure and λ is the wavelength of a boundary acoustic wave whose principal component is an SH wave, in the IDT electrodes 3A to 3C in the structure according to the above preferred embodiment. Each of the symbols X1 to X15 in FIG. 4 indicates that the level of the response at a higher mode is in the range illustrated in Table 1 below.

TABLE 1

| | Magnitude Range of Higher Mode Response |
|---|---|
| X1 | 45.0 < R ≦ 47.5 |
| X2 | 42.5 < R ≦ 45.0 |
| X3 | 40.0 < R ≦ 42.5 |
| X4 | 37.5 < R ≦ 40.0 |

TABLE 1-continued

| | Magnitude Range of Higher Mode Response |
|---|---|
| X5 | 35.0 < R ≦ 37.5 |
| X6 | 32.5 < R ≦ 35.0 |
| X7 | 30.0 < R ≦ 32.5 |
| X8 | 27.5 < R ≦ 30.0 |
| X9 | 25.0 < R ≦ 27.5 |
| X10 | 22.5 < R ≦ 25.0 |
| X11 | 20.0 < R ≦ 22.5 |
| X12 | 17.5 < R ≦ 20.0 |
| X13 | 15.0 < R ≦ 17.5 |
| X14 | 12.5 < R ≦ 15.0 |
| X15 | 10.0 < R ≦ 12.5 |

In FIG. 4, the normalized thickness h/λ was changed in the range of about 0.0295 to about 0.0365, that is, about 2.95% to about 3.65%, and the propagation orientation ψ was changed in the range of about 0° to about 15°, for example.

The range in which the level of the response at a higher mode is at or above about 25 dB is X1 to X9 described above, which are in an upper left region with respect to the broken line C illustrated in FIG. 4. Such a region can be expressed by the following Expression (1).

$$h/\lambda \times 100 \leq \text{about } 0.0019 \times \psi^2 + \text{about } 0.0115 \times \psi + \text{about } 3.0 \qquad \text{Ex. (1)}$$

That is, the right side of the above expression (1) is obtained by approximation of the broken line C in FIG. 4.

Accordingly, in a range that satisfies the expression (1), that is, for the above structure including the LiNbO₃ substrate whose Euler angles are about (0°, 115°, ψ) as a piezoelectric body, it was discovered that, when ψ of the Euler angles is in the range of about 0° to about 30°, making the normalized thickness h/λ, where h is the thickness of the first electrode film and λ is the wavelength of a boundary acoustic wave whose principal component is an SH wave, be in a range that satisfies the above expression (1) enables efficient reduction in response at a higher mode.

For the boundary acoustic wave device 1 according to the present preferred embodiment, the first dielectric layer 6 including the SiO₂ layer being a medium in which an acoustic velocity is relatively low is disposed between the piezoelectric body 2 including the LiNbO₃ substrate being a medium in which an acoustic velocity is relatively high and the second dielectric layer 7 including the SiN layer, thereby confining a boundary acoustic wave in the first dielectric layer 6 due to waveguide effects. Accordingly, if the acoustic velocity of a propagating boundary acoustic wave is higher than the acoustic velocity for a relatively high acoustic velocity medium, the boundary acoustic wave propagates at a leakage mode and the attenuation is large. It is assumed that a reduction in response occurs when the acoustic velocity at a higher mode is larger than a certain level because of leakage of the response at a higher mode to the direction of the LiNbO₃ substrate caused by the acoustic velocity at a higher mode exceeding the acoustic velocity of the fast transversal wave in the LiNbO₃ substrate. Accordingly, if the acoustic velocity of the fast transversal wave in the LiNbO₃ substrate can be lowered, the response at a higher mode can be reduced.

FIGS. 5 to 13 illustrate dependence of the acoustic velocity of a fast transversal wave and the acoustic velocity of a slow transversal wave in the LiNbO₃ substrate on various values of ψ of the Euler angles (0°, 0, ψ). FIGS. 5 to 13 reveal that, when θ is in the range of about 90° to about 130°, the acoustic velocity of the fast transversal wave can decrease with an increase in ψ and the response at a higher mode can decrease with an increase in ψ, irrespective of the value of θ.

The dependence of the acoustic velocity of the fast transversal wave of the LiNbO$_3$ substrate on ψ is substantially the same as that for ψ=0° when ψ is smaller than about 5°. If ψ exceeds about 5°, the acoustic velocity of the fast transversal wave significantly reduces. Accordingly, it is preferable that ψ be at or above about 5°.

If ψ is too large, the electromechanical coupling coefficient at a fundamental mode decreases. A study conducted by the inventor revealed that if ψ is larger than about 30°, a necessary electromechanical coupling coefficient cannot be satisfied. Accordingly, although it varies depending on the use, for example, if the device is used as an RF-stage band-pass filter of a cellular phone, it is preferable that ψ be at or below about 30° to obtain a necessary electromechanical coupling coefficient.

If the thickness of the IDT electrodes 3A to 3C is too thin, the mass of the IDT electrodes 3A to 3C is small, and waveguide effects are absent. As a result, leakage at a fundamental mode may occur. Accordingly, for the IDT electrodes 3A to 3C, it is useful that the normalized thickness h/λ of the first electrode film in the above multilayer structure defining the main configuration be at or above a value that is large to some degree. An experiment conducted by the inventor reveals that it is useful that the normalized thickness h/λ be at or above about 0.0295, that is, at or above about 2.95%, and in this case, leakage at a fundamental mode is significantly small.

Figure 14:
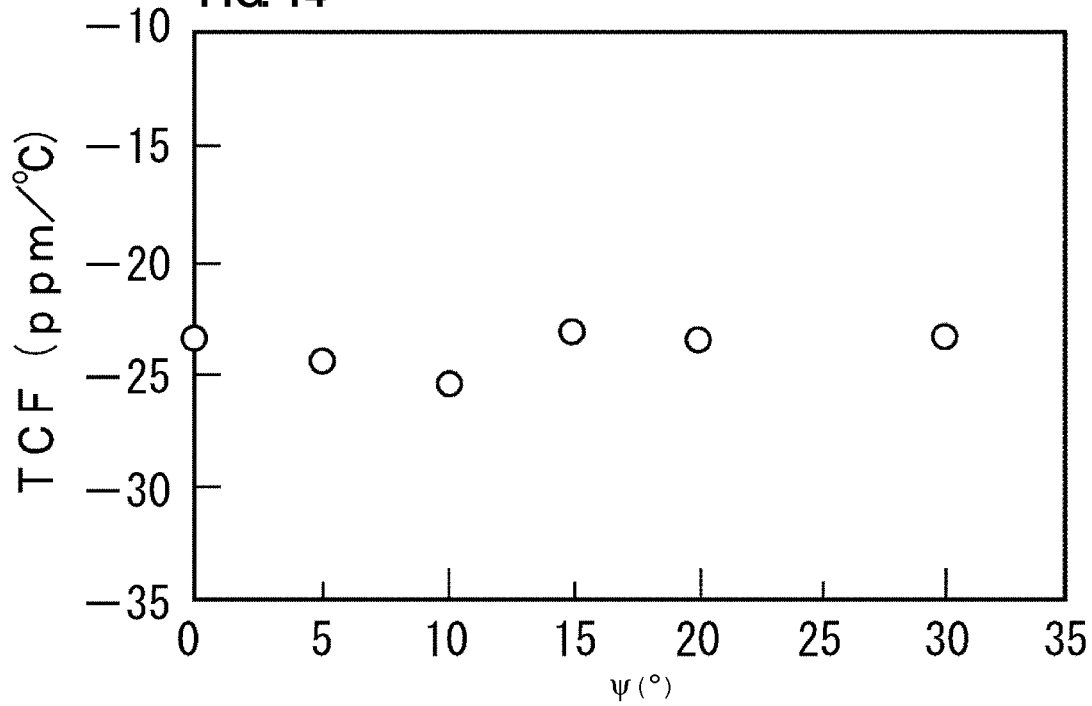
FIG. 14 illustrates a relationship between the Euler angle ψ and the temperature coefficient of resonant frequency (TCF) of the boundary acoustic wave device according to a preferred embodiment of the present invention.

FIG. 14 illustrates a relationship between the temperature coefficient of resonant frequency (TCF) for the boundary acoustic wave device 1 in which the LiNbO$_3$ substrate is used as the piezoelectric body 2 and ψ of the Euler angles of about (0°, 115°, ψ) of the LiNbO$_3$ substrate. FIG. 14 reveals that the temperature coefficient of resonant frequency (TCF) does not substantially change when ψ is about 5°, about 10°, about 15°, about 20°, and about 30°, in comparison with ψ=0°. Therefore, it was discovered that, according to the present preferred embodiment, without causing degradation in the frequency-temperature characteristic, in other words, while effects of improvement in the frequency-temperature characteristic produced by formation of the first dielectric layer 6 including the SiO$_2$ layer are ensured, a spurious component caused by a higher mode can be reduced.

Figure 15:
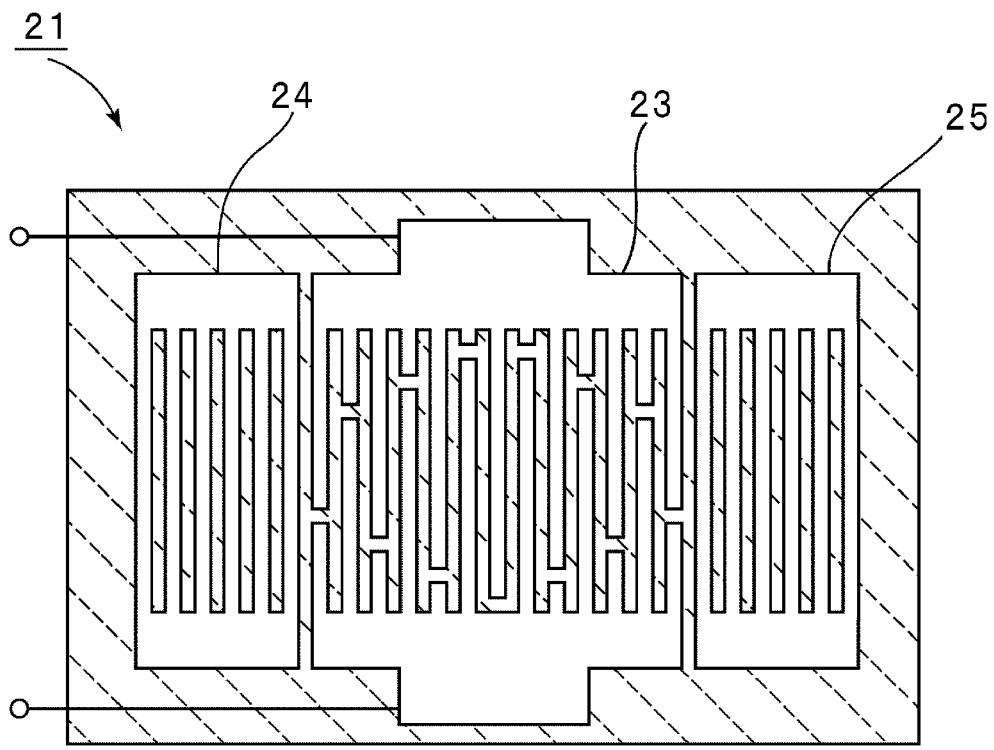
FIG. 15 is a schematic plan view that illustrates an electrode structure of the boundary acoustic wave device according to a preferred embodiment of the present invention.

Next, a reason why it is useful that θ of the Euler angles of the LiNbO$_3$ substrate defining the piezoelectric body 2 be in the range of about 90° to about 127° is described below. A 1-port boundary acoustic wave resonator including an electrode structure illustrated in FIG. 15 was prepared as the boundary acoustic wave device according to one preferred embodiment of the present invention. Referring to FIG. 15, a boundary acoustic wave resonator 21 includes an IDT electrode 23 and reflectors 24 and 25 arranged at both sides of the IDT electrode 23 in the direction of propagation of a boundary acoustic wave. The IDT electrode 23 is subjected to apodization weighting, as illustrated. A resonance characteristic when θ of the Euler angles was changed in the structure in which the first dielectric layer including the SiO$_2$ layer and the second dielectric layer including the SiN layer were arranged in a similar way to the above preferred embodiment so as to cover the IDT electrode 23 was measured.

Figure 16:
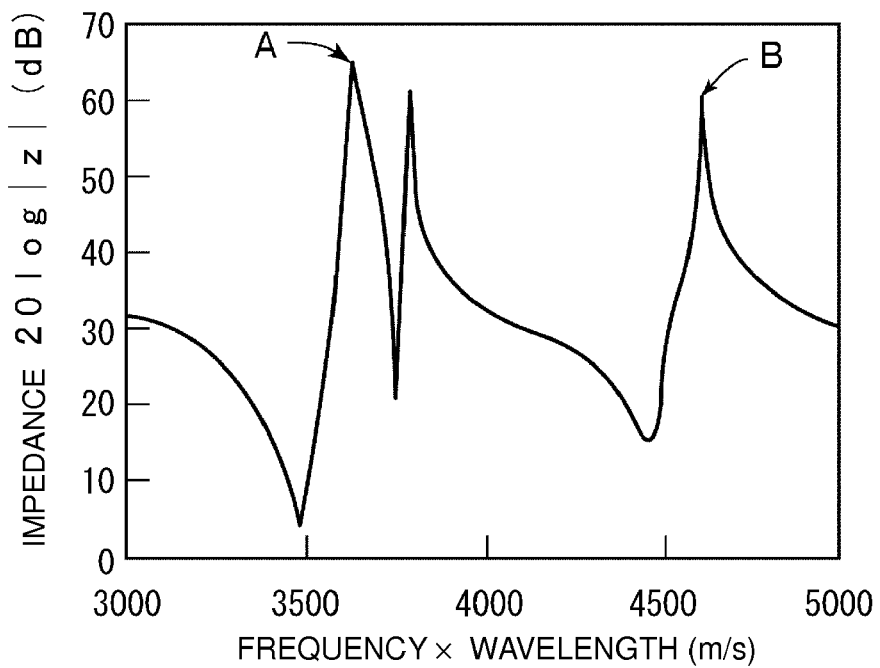
FIG. 16 illustrates an impedance characteristic when the Euler angles of a LiNbO₃ substrate of the boundary acoustic wave device according to a preferred embodiment of the present invention are (0°, 90°, 0°).
Figure 17:
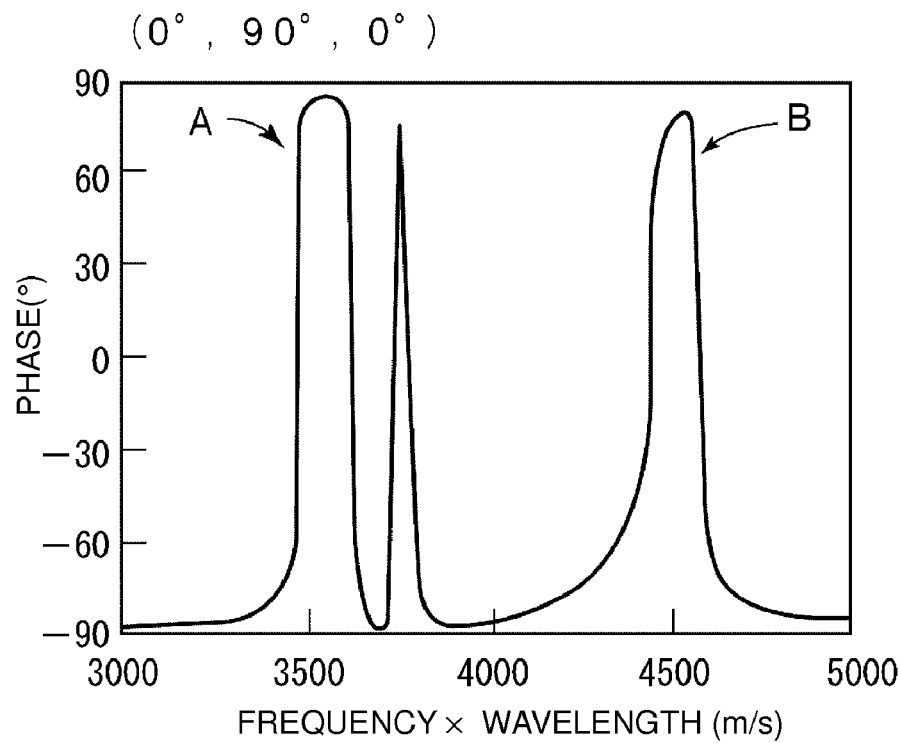
FIG. 17 illustrates a phase characteristic when the Euler angles of the LiNbO₃ substrate of the boundary acoustic wave device according to a preferred embodiment of the present invention are (0°, 90°, 0°).
Figure 18:
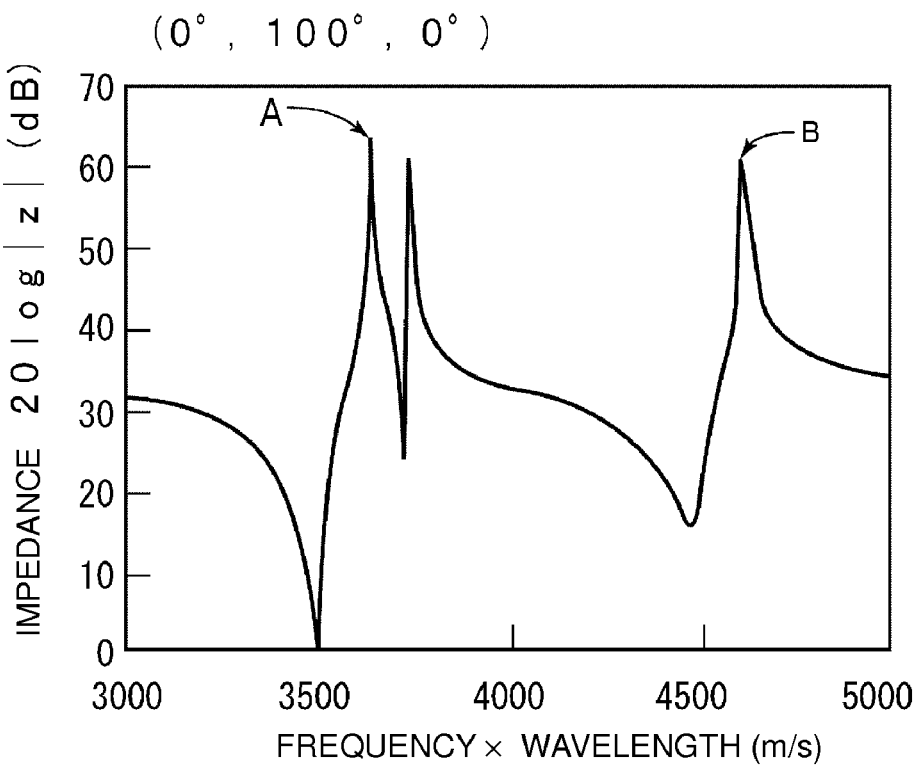
FIG. 18 illustrates an impedance characteristic when the Euler angles of the LiNbO₃ substrate of the boundary acoustic wave device according to a preferred embodiment of the present invention are (0°, 100°, 0°).
Figure 19:
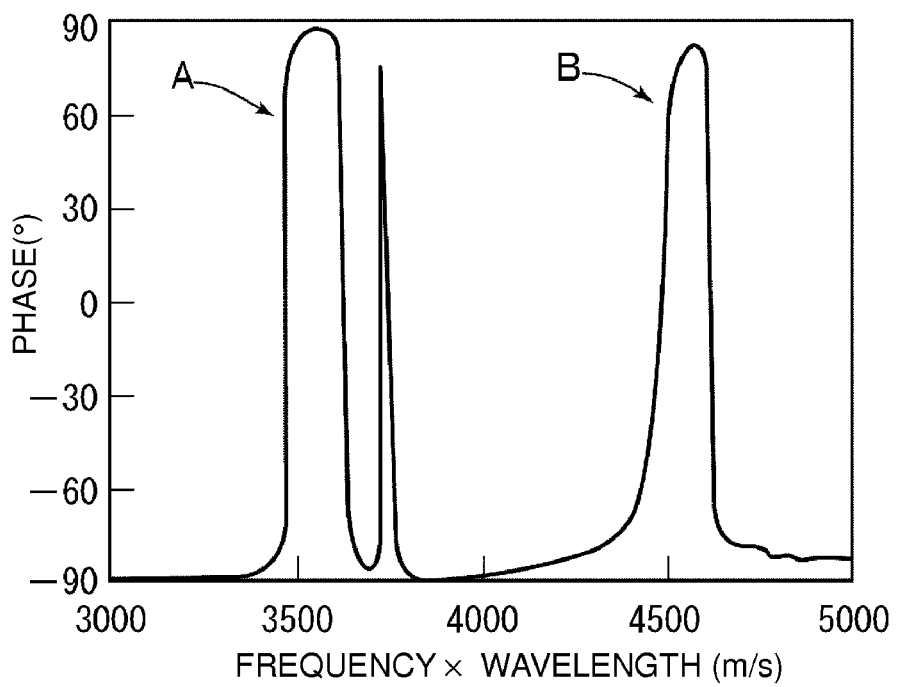
FIG. 19 illustrates a phase characteristic when the Euler angles of the LiNbO₃ substrate of the boundary acoustic wave device according to a preferred embodiment of the present invention are (0°, 100°, 0°).
Figure 20:
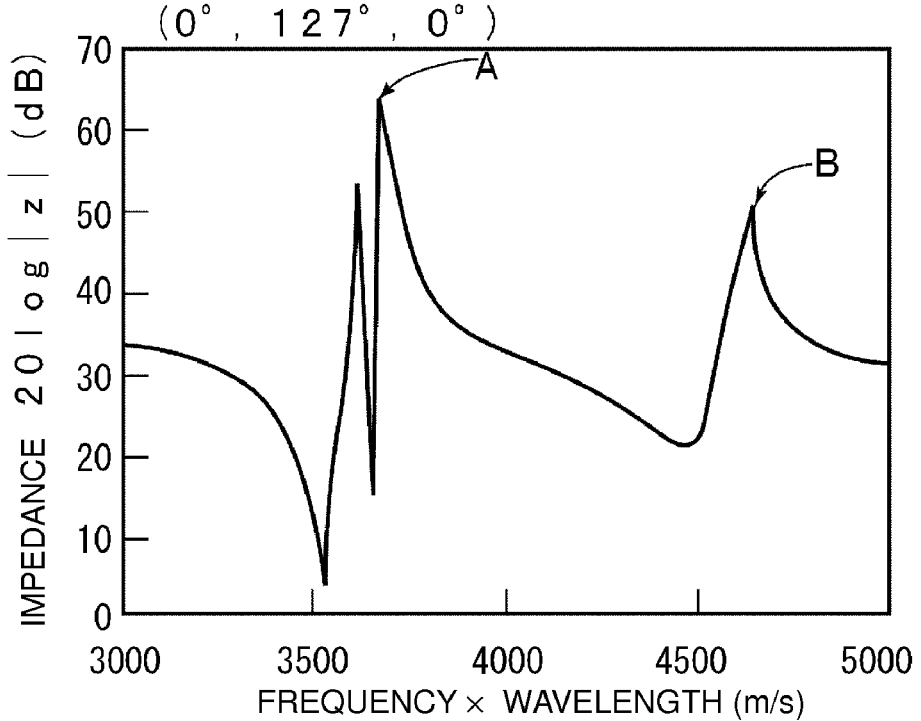
FIG. 20 illustrates an impedance characteristic when the Euler angles of the LiNbO₃ substrate of the boundary acoustic wave device according to a preferred embodiment of the present invention are (0°, 127°, 0°).
Figure 21:
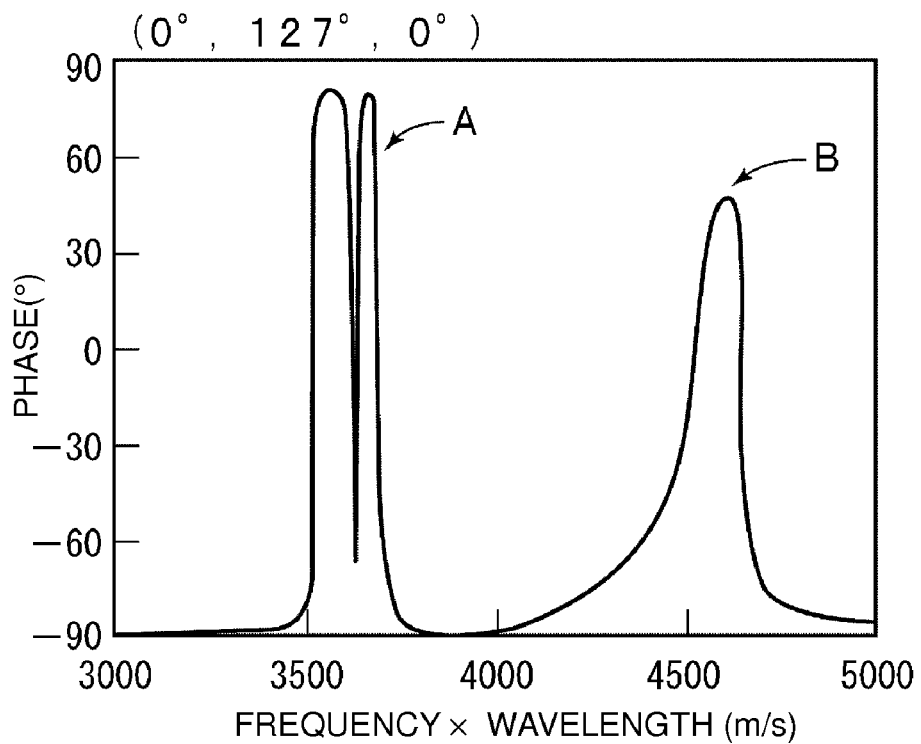
FIG. 21 illustrates a phase characteristic when the Euler angles of the LiNbO₃ substrate of the boundary acoustic wave device according to a preferred embodiment of the present invention are (0°, 127°, 0°).

FIGS. 16 and 17 illustrate an impedance characteristic and a phase characteristic when the Euler angles are about (0°, 90°, 0°), respectively. FIGS. 18 and 19 illustrate an impedance characteristic and a phase characteristic when the Euler angles are about (0°, 100°, 0°), respectively. FIGS. 20 and 21 illustrate an impedance characteristic and a phase characteristic when the Euler angles are about (0°, 127°, 0°), respectively.

FIGS. 18 to 21 reveal that, when θ of the Euler angles is about 90°, about 100°, and about 127°, the impedance ratio for the response at a fundamental mode indicated by the arrow A is at or above about 60 dB and a sufficient large electromechanical coupling coefficient is ensured. Accordingly, the Euler angle θ may preferably be in the range of 90° to 127°, for example. With this, the insertion loss can be sufficiently small.

For the above preferred embodiment, SiN is illustrated as the second dielectric layer 7, that is, the dielectric material in which an acoustic velocity is relatively high arranged above the first dielectric layer 6. However, other appropriate dielectric materials in which an acoustic velocity of a transversal wave is higher than that for SiO$_2$ and higher than at least about 5000 m/s can be used, for example. Examples of such a dielectric material can include SiN, aluminum oxide (Al$_2$O$_3$), aluminum nitride (AlN), silicon (Si), silicon oxinitride (SiON), and diamond-like carbon (DLC).

A preferable structure of the IDT electrode is a multilayer structure that includes a first electrode film including Pt or a Pt-based alloy and a second electrode film including Al or an Al-based alloy. As in the above preferred embodiment, a third electrode film including another metal, such as a Ti film, may further be provided. Examples of such a metal can include Au, Ag, Cu, Ta, W, Ni, Fe, Cr, Mo, Ti, and an alloy whose principal component is at least one of these metals. In any of these instances, an appropriate metal having a higher density than that of SiO$_2$ can be used. The use of a metal having a higher density than that of SiO$_2$ can increase a reflection coefficient of the IDT electrode.

Like the Ti layer in the above preferred embodiment, as a barrier layer to prevent interdiffusion between adjacent electrode films, a metal layer other than the first and second metal layers may be provided. As an adherence layer to increase the adherence ability between adjacent electrode layers, a metal layer that includes another metal or an alloy containing another metal, other than the Ti layer, may be provided.

For the boundary acoustic wave device according to various preferred embodiments of the present invention, an electrode structure, that is, an electrode structure defining a resonator and a filter is not particularly limited. Various kinds of electrode structures of an elastic wave device other than the illustrated electrode structure can also be used.

Preferred embodiments of the present invention are applicable to not only a boundary acoustic wave device but also to a surface acoustic wave device that uses a surface acoustic wave whose principal component is an SH wave.

Figure 22:
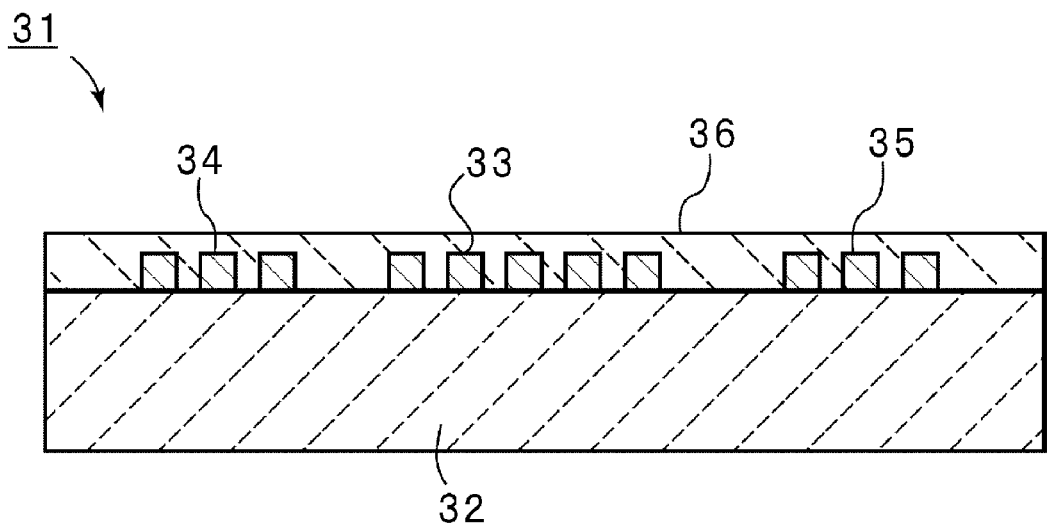
FIG. 22 is a schematic front cross-sectional view for describing a surface acoustic wave device according to another preferred embodiment of the present invention.
Figure 23:
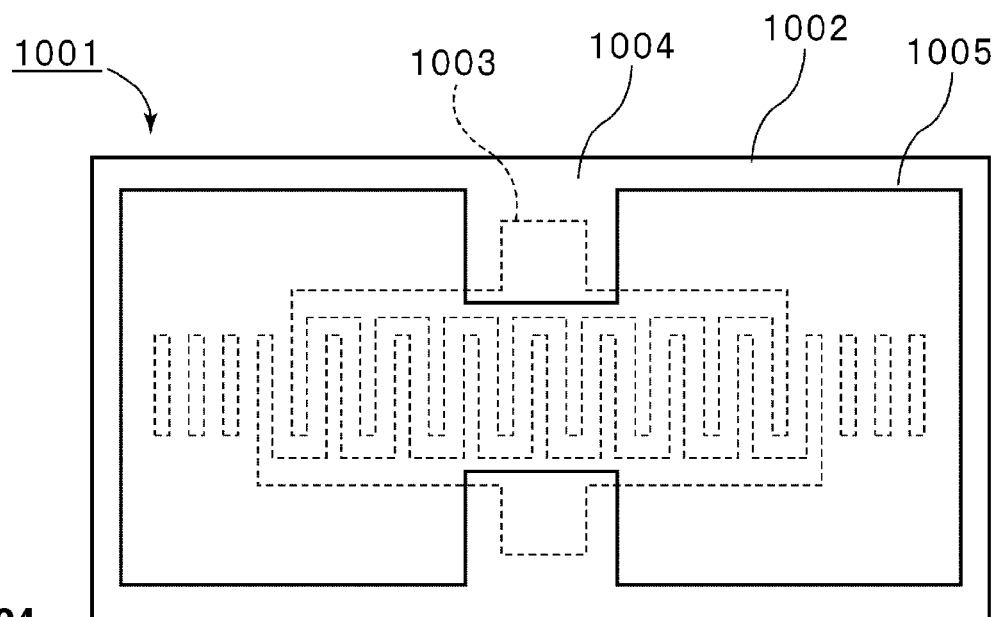
FIG. 23 is a schematic plan view of a traditional boundary acoustic wave device.
Figure 24:
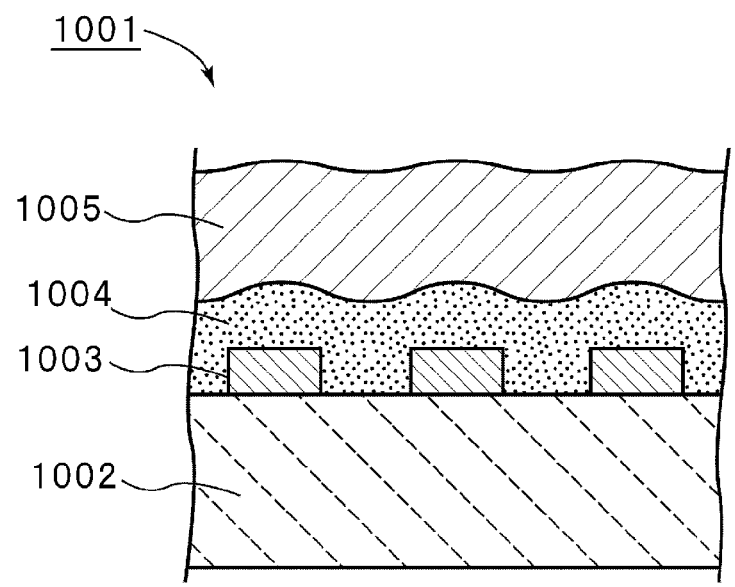
FIG. 24 is a schematic partially cut-away front cross-sectional view that illustrates an enlarged main portion of the traditional boundary acoustic wave device.

FIG. 22 is a front cross-sectional view that schematically illustrates a surface acoustic wave device according to a second preferred embodiment of the present invention. For a surface acoustic wave device 31 according to the present preferred embodiment, an IDT electrode 33 is disposed on a piezoelectric body 32. A first dielectric layer 36 including a SiO$_2$ layer is disposed so as to cover the IDT electrode 33. Here, the electrode structure of the IDT electrode 33 is similar to that of the IDT electrodes 3A to 3C illustrated in FIG. 1B. Reflectors 34 and 35 are arranged at both sides of the IDT electrode 33 in the direction of propagation of a surface acoustic wave. Therefore, a 1-port surface acoustic wave resonator is configured. Also with the surface acoustic wave device 31, in accordance with a preferred embodiment of the present invention, providing the first dielectric layer including the SiO$_2$ layer and the second dielectric layer on the piezoelectric body including the LiNbO$_3$ substrate and configuring the device so as to satisfy the above expression (1) improves the frequency-temperature characteristic and reduces a spurious component caused by a higher mode.

In this specification, as the Euler angles (φ, θ, ψ) representing a cutting plane of a substrate and the direction of propagation of a boundary acoustic wave, the right-handed system Euler angles described in the literature "Danseiha Soshi Gijutsu Handobukku" (Handbook of Acoustic Wave Device Technology), Acoustic wave device technology 150th committee of Japan Society for the Promotion of Science, the first impression of the first edition, issued on Nov. 30, 2001, page 549, were used.

That is, the X axis is rotated counterclockwise around the Z axis by φ with respect to the crystallographic axes X, Y, and Z of the LiNbO$_3$ substrate, and an Xa axis is thus obtained.

Next, the Z axis is rotated counterclockwise by θ around the Xa axis, and a Z' axis is thus obtained.

A plane that includes the Xa axis and has the Z' axis as the normal line was a cutting plane of the substrate.

A direction of the axis X' obtained by counterclockwise rotation of the Xa axis around the Z' axis by ψ was the direction of propagation of an elastic wave.

For the crystallographic axes X, Y, and Z of the LiNbO$_3$ substrate provided as the initial values of the Euler angles, the Z axis is parallel to the c axis, the X axis is parallel to any one of the equivalent a axes in three directions, and the Y axis extends in a direction normal to a plane that includes the X axis and Z axis.

In this specification, the Euler angles (θ, φ, ψ) preferably include crystallographically equivalent Euler angles. LiNbO$_3$ is a crystal belonging to 3m point group in the trigonal system. Therefore, the following expression is satisfied.

$$F(\phi, \theta, \psi) = F(60° + \phi, -\theta, \psi)$$
$$= F(60° - \phi, -\theta, 180° - \psi)$$
$$= F(\phi, 180° + \theta, 180° - \psi)$$
$$= F(\phi, \theta, 180° + \psi)$$

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
a piezoelectric body including a LiNbO$_3$ substrate;
a first dielectric layer including a SiO$_2$ layer located on the piezoelectric body;
a second dielectric layer located on the first dielectric layer and having an acoustic velocity higher than that of the first dielectric layer; and
an IDT electrode disposed at an interface between the piezoelectric body and the first dielectric layer, which includes a multilayer structure in which a first electrode film including at least one layer including Pt or a Pt-based alloy and a second electrode film including Al or an Al-based alloy are laminated; wherein
φ and θ of Euler angles (φ, θ, ψ) of the LiNbO$_3$ substrate are in a range of φ=0±about 2° and the range of about 80°≦θ≦about 130°, respectively; and
the elastic wave device uses an elastic wave the principal component of which is an SH wave; and
ψ is in a range of about 5°≦ψ≦about 30°, and where a wavelength of the elastic wave is λ and a thickness of the first electrode film is h, a normalized thickness h/λ and ψ satisfy the following expression:

$h/\lambda \times 100 \leq$ about $0.0019 \times \psi^2 +$ about $0.0115 \times \psi +$ about $3.0$.

2. The elastic wave device according to claim 1, wherein θ of the Euler angles of the LiNbO$_3$ substrate is in a range of about 105°≦θ≦about 120°.

3. The elastic wave device according to claim 1, wherein the normalized thickness h/λ is at or above about 0.0295.

4. The elastic wave device according to claim 1, wherein the second dielectric layer includes at least one dielectric material selected from the group consisting of silicon nitride, aluminum oxide, aluminum nitride, silicon oxinitride, and diamond-like carbon, and an acoustic velocity of a slow transversal wave in the at least one dielectric material is at or above about 5000 m/s.

5. The elastic wave device according to claim 1, wherein the IDT electrode further includes a third electrode film, and the third electrode film includes a metal selected from the group consisting of Au, Ag, Cu, Ta, W, Ni, Fe, Cr, Mo, Ti, and an alloy whose principal component is at least one of the metal selected from the group consisting of Au, Ag, Cu, Ta, W, Ni, Fe, Cr, Mo, and Ti.

* * * * *